(12) United States Patent
Kato

(10) Patent No.: US 6,543,042 B2
(45) Date of Patent: Apr. 1, 2003

(54) SEMICONDUCTOR INTEGRATED CIRCUIT WITH A REDUCED SKEW AND LAYOUT METHOD IN DESIGN FOR SEMICONDUCTOR INTEGRATED CIRCUIT

(75) Inventor: Akitoshi Kato, Kanagawa (JP)

(73) Assignee: NEC Corporation, Tokyo (JP)

( * ) Notice: Subject to any disclaimer, the term of this patent is extended or adjusted under 35 U.S.C. 154(b) by 85 days.

(21) Appl. No.: 09/764,295

(22) Filed: Jan. 19, 2001

(65) Prior Publication Data

US 2001/0010092 A1 Jul. 26, 2001

(30) Foreign Application Priority Data

Jan. 20, 2000 (JP) .......................... 2000-011295

(51) Int. Cl.⁷ ............................................. G06F 17/50
(52) U.S. Cl. .................................. 716/10; 716/6; 716/8
(58) Field of Search ........................................ 716/1–14

(56) References Cited

U.S. PATENT DOCUMENTS

| | | | |
|---|---|---|---|
| 5,036,230 A | | 7/1991 | Bazes |
| 5,410,491 A | * | 4/1995 | Minami .................. 703/19 |
| 5,557,779 A | * | 9/1996 | Minami .................. 716/6 |
| 5,608,645 A | * | 3/1997 | Spyrou ................... 716/6 |
| 5,774,476 A | * | 6/1998 | Pressly et al. .......... 714/726 |
| 5,828,870 A | * | 10/1998 | Gunadisastra ........... 713/401 |
| 6,073,246 A | * | 6/2000 | Song et al. .............. 713/401 |

FOREIGN PATENT DOCUMENTS

| | | |
|---|---|---|
| DE | 278 904 A1 | 5/1990 |
| DE | 195 10 038 C1 | 8/1996 |
| JP | 04-267413 | 9/1992 |
| JP | 02001125937 A * | 5/2001 ........... H01L/21/82 |

OTHER PUBLICATIONS

"Skew–Reduction Method in VLSI Design", IBM Technical Disclosure Bulletin (Jul., 1993) vol. 36, issue 7, pp. 413–414.*

"Balancing Clock Trees Across Different Chips", IBM Technical Disclosure Bulletin (Feb. 1995), vol. 38, issue 2, pp. 109–110.*

"Tuning Path Delays for Synchronous Clocking", IBM Technical Disclosure Bulletin (Mar. 1995), vol. 38, iss. 3, pp. 639–640.*

* cited by examiner

*Primary Examiner*—Matthew Smith
*Assistant Examiner*—Sun James Lin
(74) *Attorney, Agent, or Firm*—Young & Thompson

(57) ABSTRACT

The present invention provides a layout method in design for a semiconductor integrated circuit having clock tree paths. The method comprises the steps of: extracting delay values of all of the clock tree paths; calculating an average delay value from the extracted delay values; comparing each of the delay values of the clock tree paths to the average delay value for extracting flip-flop circuits connected to the clock tree paths which have delay values smaller than the average delay value; and carrying out a batch-substituting process for batch-substituting all of the extracted flip-flop circuits by substitutional delay flip-flop circuits which have a delay compensating a difference between the average delay value and a maximum value of the delay values of all of the clock tree paths.

37 Claims, 12 Drawing Sheets

Flip-flop circuit with delay

SEMICONDUCTOR INTEGRATED CIRCUIT WITH A REDUCED SKEW AND LAYOUT METHOD IN DESIGN FOR SEMICONDUCTOR INTEGRATED CIRCUIT

BACKGROUND OF THE INVENTION

The present invention relates to a semiconductor integrated circuit with a reduced clock skew and a layout method in design of a semiconductor integrated circuit with a reduced clock skew.

In recent years, semiconductor integrated circuits have been on the improvements in high density integration, large scale integration and high speed performances. It is necessary that the high density integration of the semiconductor integrated circuits is realized, whist a clock skew which may cause a hold defective is reduced to improve the reliability of the semiconductor integrated circuit.

As the high density integration has been progressed with change of the design rules from 0.25 micrometers-rule through 0.18 micrometers-rule to 0.13 micrometers-rule, a difference between a maximum value and a minimum value of an interconnection delay becomes remarkable, whereby a phase difference of the clock signals, for example, a clock skew is increased. If the phase difference of the clock signals or the clock skew becomes larger than a holding value of a flip-flop circuit, then a holding defective appears on the flip-flop circuits FIG. 1 is a circuit diagram illustrative of first and second flip-flop circuits provided in a semiconductor integrated circuit to explain a holding defective of the flip-flop circuits. If a clock signal delay "N" becomes lower than a sum of a delay value "L", a first internal delay value of a first flip-flop circuit F/F1, a delay value "M", and a second internal delay value of a second flip-flop circuit F/F2, then the holding defective appears.

The clock skew value as the difference in delay of the clock signals is presumable but only after the layout and placement have been completed. For this reason, it is possible that after an automatic layout has been completed, the clock skew value is increased to cause the holding defective on the flip-flop circuit, whereby a malfunction of the flip-flop circuit may appear.

The following has been proposed to have solved the above problem. On the basis of delay informations after the automatic layout has been completed, then change of the circuit configuration, re-study and re-execution of the automatic layout are repeated until the clock skew is reduced.

FIG. 2 is a flow chart illustrative of a first conventional circuit design method.

In a step S81, the process is started.

In a step S82, a circuit design is carried out to form a net-list.

In a step S83, layout and placement of cells are executed by use of the net-list to form real interconnection data.

In a step S84, a post-layout delay information and a clock skew value are prepared on the basis of the real interconnection data and a previously prepared delay library.

In a step S85, a circuit design operation is confirmed and further a timing and the clock skew value are also confirmed.

In a step S86, it is verified whether or not any delay adjustment is needed. If the delay adjustment is needed, then the process will back to the step S82 for changing the circuit design or the step S83 for changing the cell layout. Those automatic layout processes will be repeated until the delay adjustment is not needed. If the delay adjustment is not needed, then the process is ended in a step S87.

In Japanese laid-open patent publication No, 10-327047, a second conventional technique is disclosed. A data input terminal or a data output terminal of a flip-flop circuit is coupled with a logic cell having a flip-flop circuit and being free of any delay circuit. Subsequently, a logic simulation is executed on the basis of the layout information. A timing information as the result of the logic simulation is investigated with reference to a design specification of the semiconductor integrated circuit to verify a possibility of malfunction due to the timing variation. The logic cell is replaced by another logic cell which has a delay circuit, so that the logic cell with the delay circuit is connected to the data input or output terminal of the flip-flop circuit.

It is considered that the clock signal is supplied from the common clock input terminal to the plural flip-flop circuits. A clock tree system causes that the number of the buffer circuits between the individual flip-flop circuits and the common clock input terminal becomes the same, whereby the clock skew value is reduced.

In this case, however, it is necessary to compensate the delay amount. A second conventional technique has been proposed. FIG. 3 is a flow chart illustrative of a second conventional circuit design method.

In a step S91, the process is started.

In a step S92, a circuit design is executed to form a net-list.

In a step S93, layout and placement of cells are executed by use of the net-list to form real interconnection data.

In a step S94, a post-layout delay information and a clock skew value are prepared on the basis of the real interconnection data and a previously prepared delay library.

In a step S95, on the basis of the post-layout delay information and the clock skew value, a delay value of all paths of the clock-tree is extracted.

In a step S96, on the basis of the delay value of all paths of the clock-tree, a difference between the delay value of all paths of the clock-tree and a maximum value is calculated.

In a step S97, a delay circuit, which compensates to the calculated difference between the delay value of all paths of the clock-tree and the maximum value, is selected from a delay circuit library and the delay circuit is inserted into a logic cell to form a delay circuit cell.

In a step S98, a layout of the delay circuit cell is executed to form real interconnection data.

In a step S99, on the basis of the real interconnection data and a previously prepared delay circuit library, a delay information and a clock skew value are re-prepared to complete the circuit design process in a step S100.

The above first and second conventional circuit layout methods prepare individual logic cell libraries for individual paths to verify the individual delays, whereby a design turnaround time is long.

In case of the above clock tree shown in FIG. 3, the individual delay circuits, which compensate the difference between the delay value of all circuits of the clock tree and the maximum value, is inserted into the logic cell connected to the data input or output terminal of the flip-flop circuit. There are a large number of inserting positions into which the delay circuits are inserted, in case, a layout correction is difficult. As another method, it is possible to increase the length of the interconnections so that the fast path is adjusted to a delay path. This method is, however, unavailable to the high density interconnection region.

In the above circumstances, it had been required to develop a novel layout method in design of a semiconductor integrated circuit free from the above problem.

SUMMARY OF THE INVENTION

Accordingly, it is an object of the present invention to provide a novel layout method in design of a semiconductor integrated circuit free from the above problems.

It is a further object of the present invention to provide a novel layout method in design of a semiconductor integrated circuit with a reduced clock skew to increase a design efficiency and shorten a turnaround time without providing any substantive influence to the semiconductor integrated circuit.

It is a still further object of the present invention to provide a novel method in design of a semiconductor integrated circuit to reduce a clock skew to a half of a maximum clock skew value for increasing a design efficiency and shortening a turnaround time.

It is yet a further object of the present invention to provide a novel semiconductor integrated circuit with a reduced clock skew to increase a design efficiency and shorten a turnaround time without providing any substantive influence to the semiconductor integrated circuit.

The present invention provides a layout method in design for a semiconductor integrated circuit having clock tree paths. The method comprises the steps of: extracting delay values of all of the clock tree paths; calculating an average delay value from the extracted delay values; comparing each of the delay values of the clock tree paths to the average delay value for extracting flip-flop circuits connected to the clock tree paths which have delay values smaller than the average delay value; and carrying out a batch-substituting process for batch-substituting all of the extracted lip-flop circuits by substitutional delay flip-flop circuits which have a delay compensating a difference between the average delay value and a maximum value of the delay values of all of the clock tree paths.

The present invention also provides a layout method in design for a semiconductor integrated circuit having clock tree paths. The method comprises the steps of: extracting delay values of all of the clock tree paths; calculating an average delay value from the extracted delay values; comparing each of the delay values of the clock tree paths to the average delay value for extracting flip-flop circuits connected to the clock tree paths which have delay values smaller than the average delay value; and carrying out a batch-inserting process for batch-inserting delay circuits onto previous stages of all of the extracted flip-flop circuits, and the delay circuits have a delay compensating a difference between the average delay value and a maximum value of the delay values of all of the clock tree paths.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
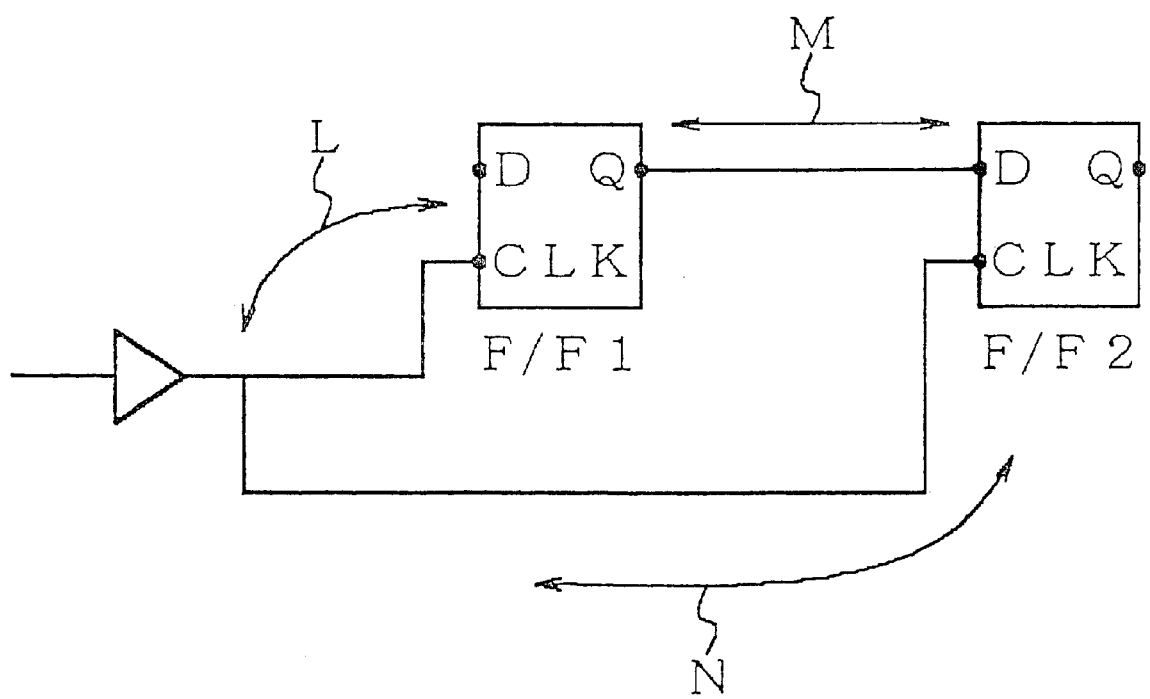
FIG. 1 is a circuit diagram illustrative of first and second flip-flop circuits provided in a semiconductor integrated circuit to explain a holding defective of the flip-flop circuits.
Figure 2:
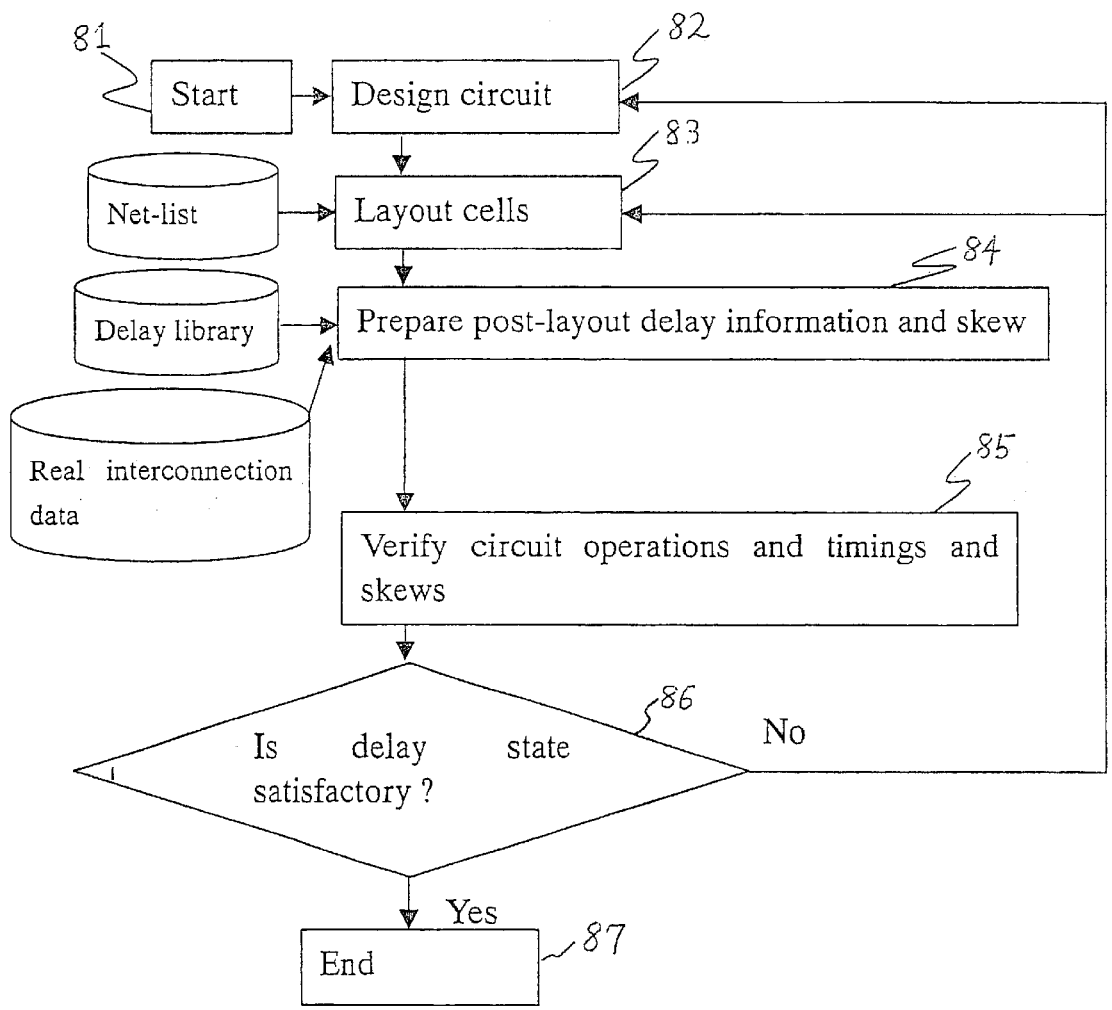
FIG. 2 is a flow chart illustrative of a first conventional circuit design method.
Figure 3:
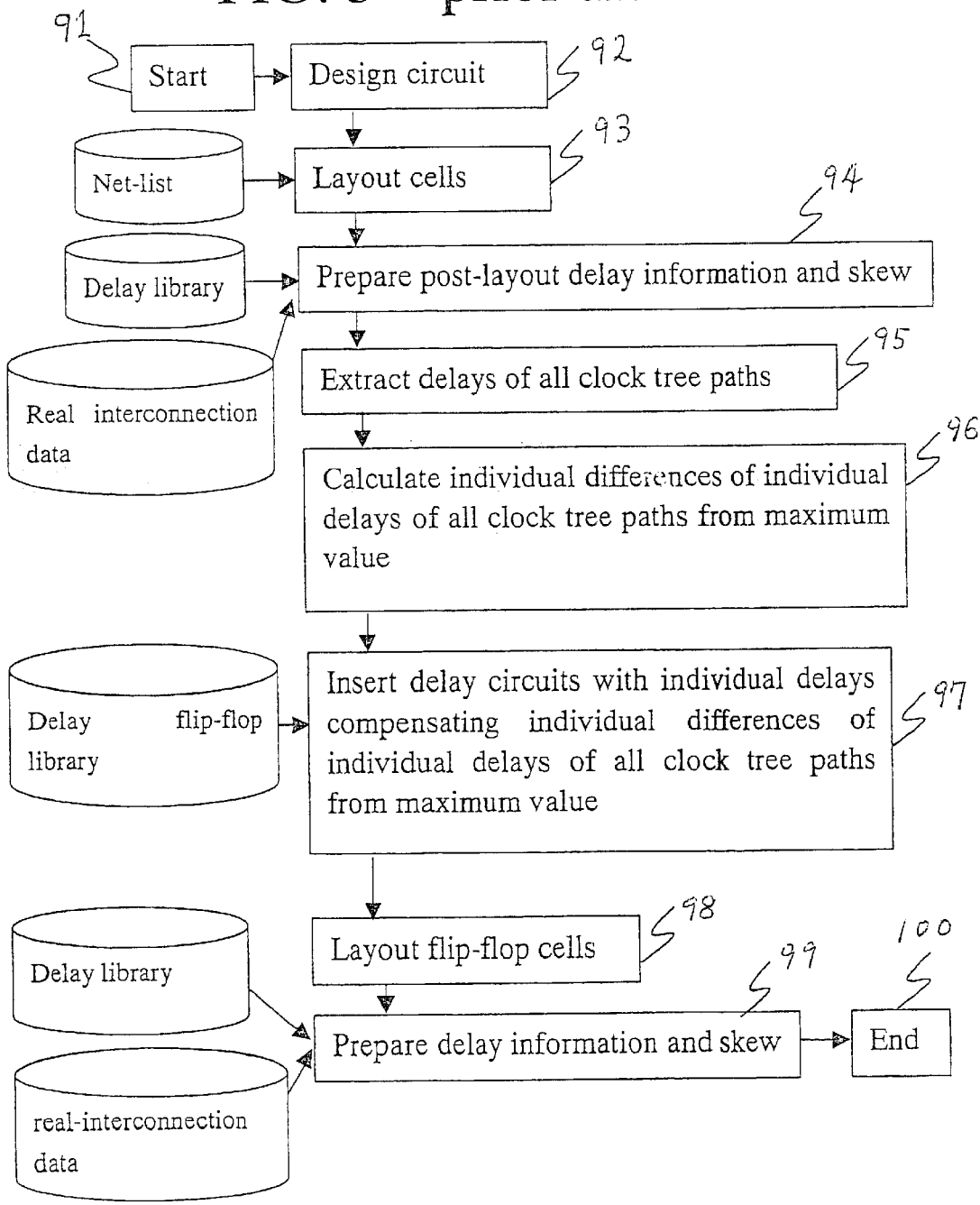
FIG. 3 is a flow chart illustrative of a second conventional circuit design method.

The first present invention provides a layout method in design for a semiconductor integrated circuit having clock tree paths. The method comprises the steps of: extracting delay values of all of the clock tree paths; calculating an average delay value from tie extracted delay values; comparing each of the delay values of the clock tree paths to the average delay value for extracting flip-flop circuits connected to the clock tree paths which have delay values smaller than the average delay value; and carrying out a batch-substituting process for batch-substituting all of the extracted flip-flop circuits by substitutional delay flip-flop circuits which have a delay compensating a difference between the average delay value and a maximum value of the delay values of all of the clock tree paths.

It is preferable that the substitutional delay flip-flop circuits are extracted from a delay flip-flop library.

It is preferable that a distribution in the number of the clock tree paths over delay value after the batch-substituting process is limited within a range between the average delay value and the maximum delay value.

It is further preferable that the number of the clock tree paths is higher in the vicinity of the average delay value and the maximum delay value than at an intermediate delay value between the average delay value and the maximum delay value.

It is further more preferable that the distribution in the number of the clock tree paths over delay value is substantially symmetrical with reference to the intermediate delay value between the average delay value and the maximum delay value.

It is preferable to further comprise the step of: carrying out a layout process for cells including the extracted flip-flop circuits and the substitutional delay flip-flop circuits to prepare real interconnected data; and preparing a delay information and a skew value on the basis of both the real interconnected data and a previously delay library.

The second present invention provides a layout method in design for a semiconductor integrated circuit having clock tree paths. The method comprises the steps of: extracting delay values of all of the clock tree paths; calculating an average delay value from the extracted delay values; comparing each of the delay values of the clock tree paths to the average delay value for extracting flip-flop circuits connected to the clock tree paths which have delay values smaller than the average delay value; and carrying out a batch-inserting process for batch-inserting delay circuits onto previous stages of all of the extracted flip-flop circuits, and the delay circuits have a delay compensating a difference between the average delay value and a maximum value of the delay values of all of the clock tree paths.

It is preferable that the delay circuits are extracted from a delay circuit library.

It is also preferable that a distribution in the number of the clock tree paths over delay value after the batch-inserting process is limited within a range between the average delay value and the maximum delay value.

It is further preferable that the number of the clock tree paths is higher in the vicinity of the average delay value and the maximum delay value than at an intermediate delay value between the average delay value and the maximum delay value.

It is further more preferable that the distribution in the number of the clock tree paths over delay value is substantially symmetrical with reference to the intermediate delay value between the average delay value and the maximum delay value.

It is preferable to further comprises the step of carrying out the layout process for cells including the extracted flip-flop circuits and the delay circuits to prepare real interconnection data; and preparing a delay information and a skew value on the basis of both the real interconnection data and a previously prepared delay library.

The third present invention provides a computer program for layout processes in design for a semiconductor integrated circuit having clock tree paths. The computer program comprises the steps of: extracting delay values of all of the clock tree paths; calculating an average delay value from the extracted delay values; compare each of the delay values of the clock tree paths to the average delay value for extracting flip-flop circuits connected to the clock tree paths which have delay values smaller than the average delay value; and carrying out a batch-substituting process for batch-substituting all of the extracted flip-flop circuits by substitutional delay flip-flop circuits which have a delay compensating a difference between the average delay value and a maximum value of the delay values of all of the clock tree paths.

It is preferable that the substitutional delay flip-flop circuits are extracted from a delay flip-flop library.

It is also preferable that a distribution in the number of the clock tree paths over delay value after the batch-substituting process is limited within a range between the average delay value and the maximum delay value.

It is further preferable that the number of the clock tree paths is higher in the vicinity of the average delay value and the maximum delay value than at an intermediate delay value between the average delay value and the maximum delay value.

It is further more preferable that the distribution in the number of the clock tree paths over delay value is substantially symmetrical with reference to the intermediate delay value between the average delay value and the maximum delay value.

It is preferable to further comprise the step of: carrying out a layout process for cells including the extracted flip-flop circuits and the substitutional delay flip-flop circuits to prepare real interconnection data; and preparing a delay information and a skew value on the basis of both the real interconnection data and a previously prepared delay library.

The fourth present invention provides a computer program for layout processes in design for a semiconductor integrated circuit having clock tree paths. The computer program comprises the steps of: extracting delay values of all of the clock tree paths; calculating an average delay value from the extracted delay values; comparing each of the delay values of the clock tree paths to the average delay value for extracting flip-flop circuits connected to the clock tree paths which have delay values smaller than the average delay value; and carrying out a batch-inserting process for batch-inserting delay circuits onto previous stages of all of the extracted flip-flop circuits, and the delay circuits have a delay compensating a difference between the average delay value and a maximum value of the delay values of all of the clock tree paths.

It is further preferable that the delay circuits are extracted from a delay circuit library.

It is also preferable that a distribution in the number of the clock tree paths over delay value after the batch-inserting process is limited within a range between the average delay value and the maximum delay value.

It is further preferable that the number of the clock tree paths is higher in the vicinity of the average delay value and the maximum delay value than at an intermediate delay value between the average delay value and the maximum delay value.

It is further more preferable that the distribution in the number of the clock tree paths over delay value is substantially symmetrical with reference to the intermediate delay value between the average delay value and the maximum delay value.

It is preferable to further comprise the step of: carrying out a layout process for cells including the extracted flip-flop circuits and the delay circuits to prepare real interconnection data; and preparing a delay information and a skew value on the basis of both the real interconnection data and a previously prepared delay library.

The fifth present invention provides a semiconductor integrated circuit having a common clock input terminal, plural flip-flop circuits, and clock tree paths extending from the common clock input terminal to the flip-flop circuits, wherein the flip-flop circuits are classified into first type flip-flop circuits having delay values in a range between an average delay value of individual delay values of the clock tree paths and a maximum value of the individual delay values of all of the clock tree paths, and second type flip-flop circuits having a delay which compensates a difference between the average delay value and the maximum value.

It is preferable that the second type flip-flop circuit comprises a flip-flop circuit configuration only, and the second type flip-flop circuit comprises both the flip-flop circuit configuration and a delay circuit configuration provided on a previous stage of the flip-flop circuit configuration.

It is also preferable that a distribution in the number of the clock tree paths over delay value after the batch-inserting process is limited within a range between the average delay value and the maximum delay value.

It is further preferable that the number of the clock tree paths is higher in the vicinity of the average delay value and the maximum delay value than at an intermediate delay value between the average delay value and the maximum delay value.

It is further more preferable that the distribution in the number of the clock tree paths over delay value is substantially symmetrical with reference to the intermediate delay value between the average delay value and the maximum delay value.

The sixth present invention provides a semiconductor integrated circuit having a common clock input terminal, plural flip-flop circuits, and clock tree paths extending from the common block input terminal to the flip-flop circuits, wherein the flip-flop circuits are classified into first type flip-flop Circuits having delay values in a first range between an average delay value of individual delay values of the clock tree paths and a maximum value of the individual delay values of all of the clock tree paths, and second type flip-flop circuits having delay values in a second range between the average delay value and a minimum value of the individual delay values of all of the clock tree paths, and wherein delay circuits having a delay which compensates a difference between the average delay value and the maximum value are provided on previous stages of the second type flip-flop circuits.

It is preferable that a distribution in the number of the clock tree paths over delay value after the batch-inserting process is limited within a range between the average delay value and the maximum delay value.

It is also preferable that the number of the clock tree paths is higher in the vicinity of the average delay value and the maximum delay value than at an intermediate delay value between the average delay value and the maximum delay value.

It is further preferable that the distribution in the number of the clock tree paths over delay value is substantially symmetrical with reference to the intermediate delay value between the average delay value and the maximum delay value.

PREFERRED EMBODIMENT

First Embodiment

Figure 4:
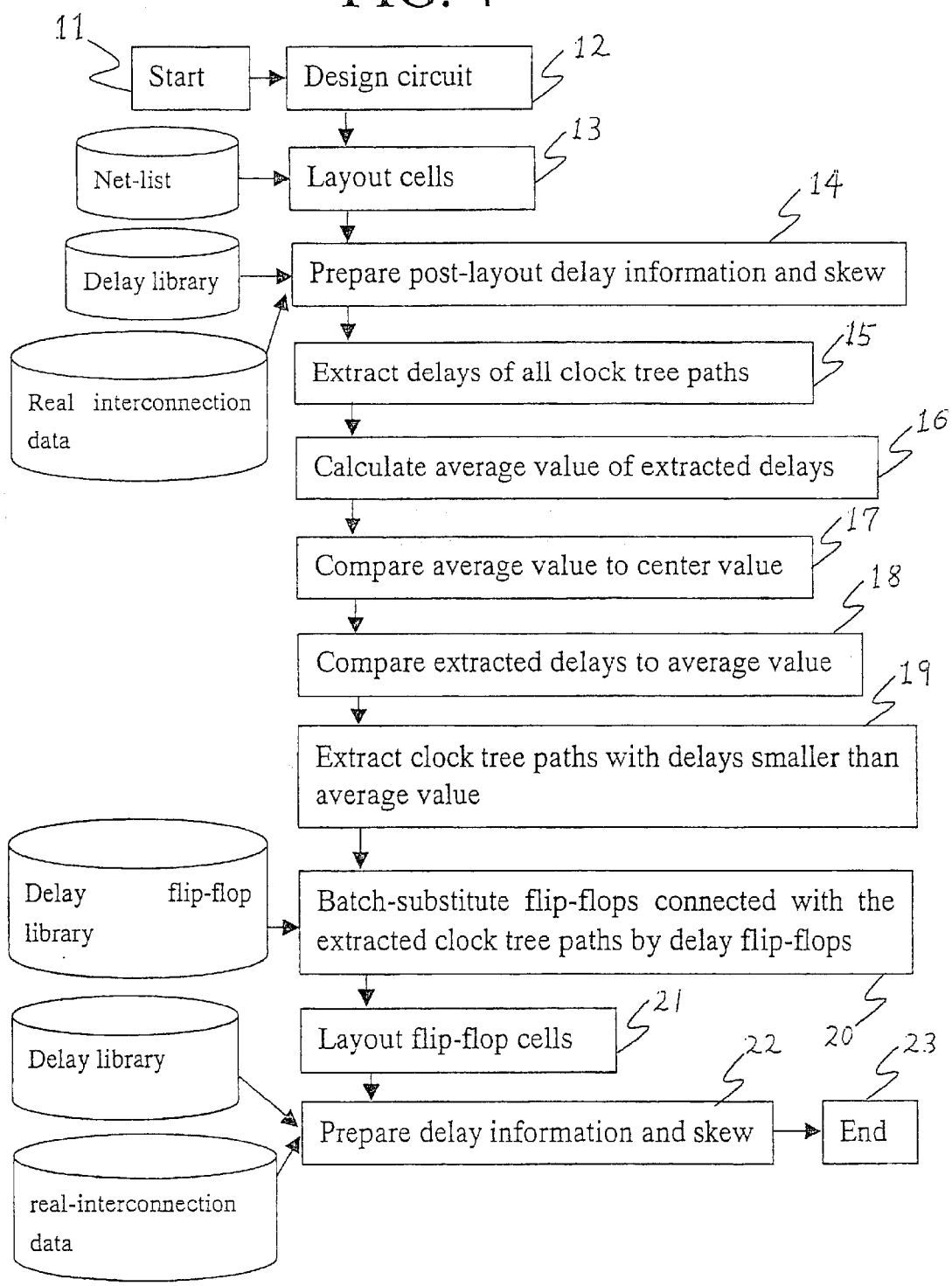
FIG. 4 is a flow chart illustrative of a first novel method in design of a semiconductor integrated circuit with a reduced clock skew to increase a design efficiency and shorten a turnaround time without providing any substantive influence to the semiconductor integrated circuit in a first embodiment in accordance with the present invention.

A first embodiment according to the present invention will be described in detail with reference to the drawings. FIG. 4 is a flow chart illustrative of a first novel method in design of a semiconductor integrated circuit with a reduced clock skew to increase a design efficiency and shorten a turn-around time without providing any substantive influence to the semiconductor integrated circuit in a first embodiment in accordance with the present invention.

In a step S11, the process is started.

In a step S12, a circuit design is executed to form a net-list.

In a step S13, layout and placement of cells are executed by use of the net-list to form real interconnection data.

In a step S14, a post-layout delay information and a clock skew value are prepared on the basis of the real interconnection data and a previously prepared delay library.

In a step S15, on the basis of the post-layout delay information and the clock skew value, a delay value of each of all paths of the clock-tree is extracted.

In a step S16, on the basis of the delay values of all paths of the clock-tree, an average of the delay values is calculated.

Figure 5:
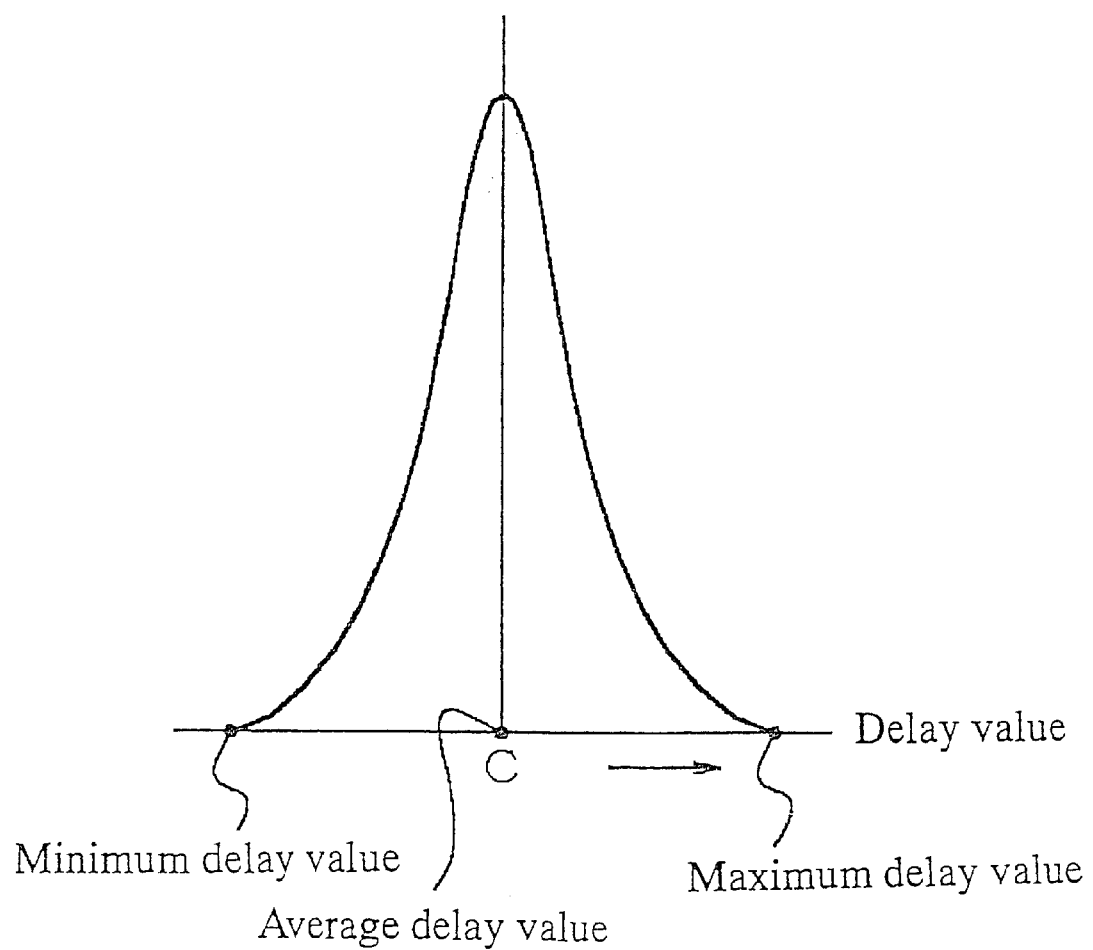
FIG. 5 is a diagram illustrative of a distribution of a delay value of clock tree paths to extracted flip-flop circuits in a first embodiment in accordance with the present invention.

In a step S17, it is verified whether or not the calculated average is within an acceptable range which has previously been set, wherein the acceptable range has a range center which corresponds to an intermediate value between the maximum and minimum values of the delay values. FIG. 5 is a diagram illustrative of a distribution of a delay value of clock tree paths to extracted flip-flop circuits in a first embodiment in accordance with the present invention. The distribution of the delay value of the clock tree paths is symmetrical with reference to the average value "C" which is intermediate between the maximum and minimum delay values. It is preferable that the distribution of the delay value of the clock tree paths is the normal distribution, wherein the average value corresponds to the center of the acceptable range. If the calculated average is within the acceptable range, then the calculated average is not so different from the center of the maximum and minimum delay values. This means that the distribution of the delay value of the clock tree paths is almost symmetrical with reference to the center of the maximum and minimum delay values. In this case, the following batch process is carried out. If the calculated average is out the acceptable range, then the calculated average is largely different from the center of the maximum and minimum delay values. This means that the distribution of the delay value of the clock tree paths is largely asymmetrical with reference to the center of the maximum and minimum delay values. In this case, individual processes are executed in place of the batch-process.

In a step S18, if the calculated average is within the acceptable range, then each of the extracted individual delay values of the individual clock tree paths is compared to the calculated average value.

In a step S19, clock tree paths faster than (with all delays smaller than) the average value are extracted.

Figure 6:
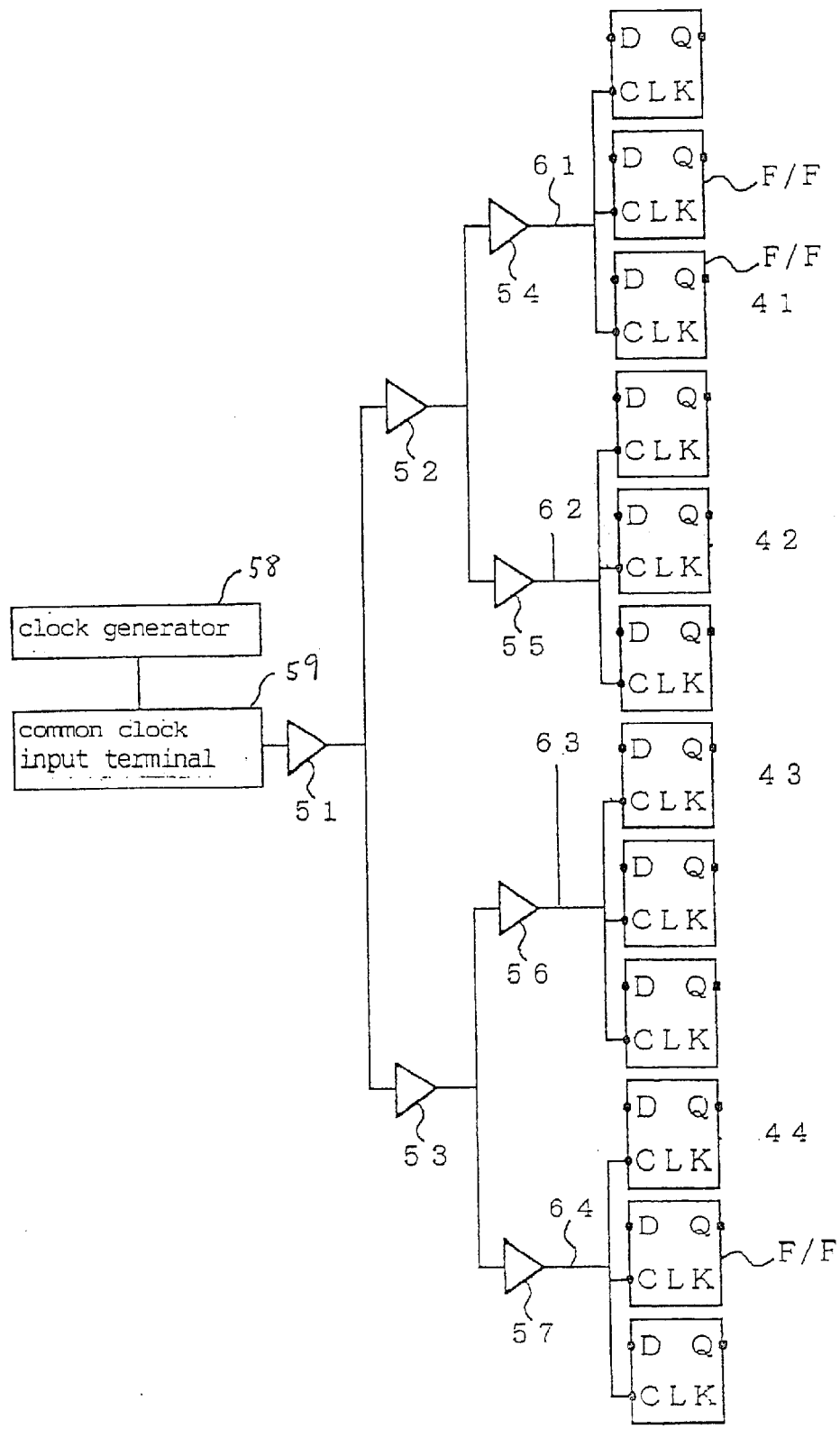
FIG. 6 is a block diagram illustrative of an extracted clock tree in a first novel design method in a first embodiment in accordance with the present invention.

FIG. 6 is a block diagram illustrative of an extracted clock tree in a first novel design method in a first embodiment in accordance with the present invention. A clock signal is generated by a clock generator circuit 58. The clock signal is then inputted into a common clock input terminal 59 of a first buffer circuit 51. The clock signal is then transmitted from the first buffer circuit 51 to second and third buffer circuits 52 and 53. The clock signal is further transmitted from the second buffer circuit 52 to fourth and fifth buffer circuits 54 and 55. The clock signal is further transmitted from the third buffer circuit 53 to sixth and seventh buffer circuits 56 and 57. The clock signal is furthermore transmitted from the fourth buffer circuit 54 through a tree path 61 to a three flip-flop circuits 41. The clock signal is furthermore transmitted from the fifth buffer circuit 55 through a tree path 62 to three flip-flop circuits 42. The clock signal is furthermore transmitted from the sixth buffer circuit 56 through a tree path 63 to three flip-flop circuits 43. The clock signal is furthermore transmitted from the seventh buffer circuit 57 through a tree path 64 to three flip-flop circuits 44. The above tree path 61, 62, 63 and 64 are extracted as the faster clock tree paths than the average value. As shown in FIG. 6, the tree path 61 extends from the common clock input terminal 59 through the buffer circuits 51, 52, and 54 to the three flip-flop circuits 41. The tree path 62 extends from the common clock input terminal 59 through the buffer circuits 51, 52, and 55 to the three flip-flop circuits 42. The tree path 63 extends from the common clock input terminal 59 through the buffer circuits 51, 53, and 56 to the three flip-flop circuits 43. The tree path 64 extends from the common clock input terminal 59 through the buffer circuits 51, 53, and 57 to the three flip-flop circuits 44. Whereas the four clock tree paths are faster than the average delay value, it is probable that six clock tree paths are extracted as faster than the average value instead of the twelve flip-flop circuits.

In a step S20, a batch-replacing process is carried out, wherein the flip-flop circuits coupled to the clock tree paths faster in delay value than the average value are substituted with substitute flip-flop circuits with delays which compensate to a difference between the average value and the maximum value. The substitute delay flip-flop circuits are selected from a previously prepared delay flip-flop circuit library.

Figure 7:
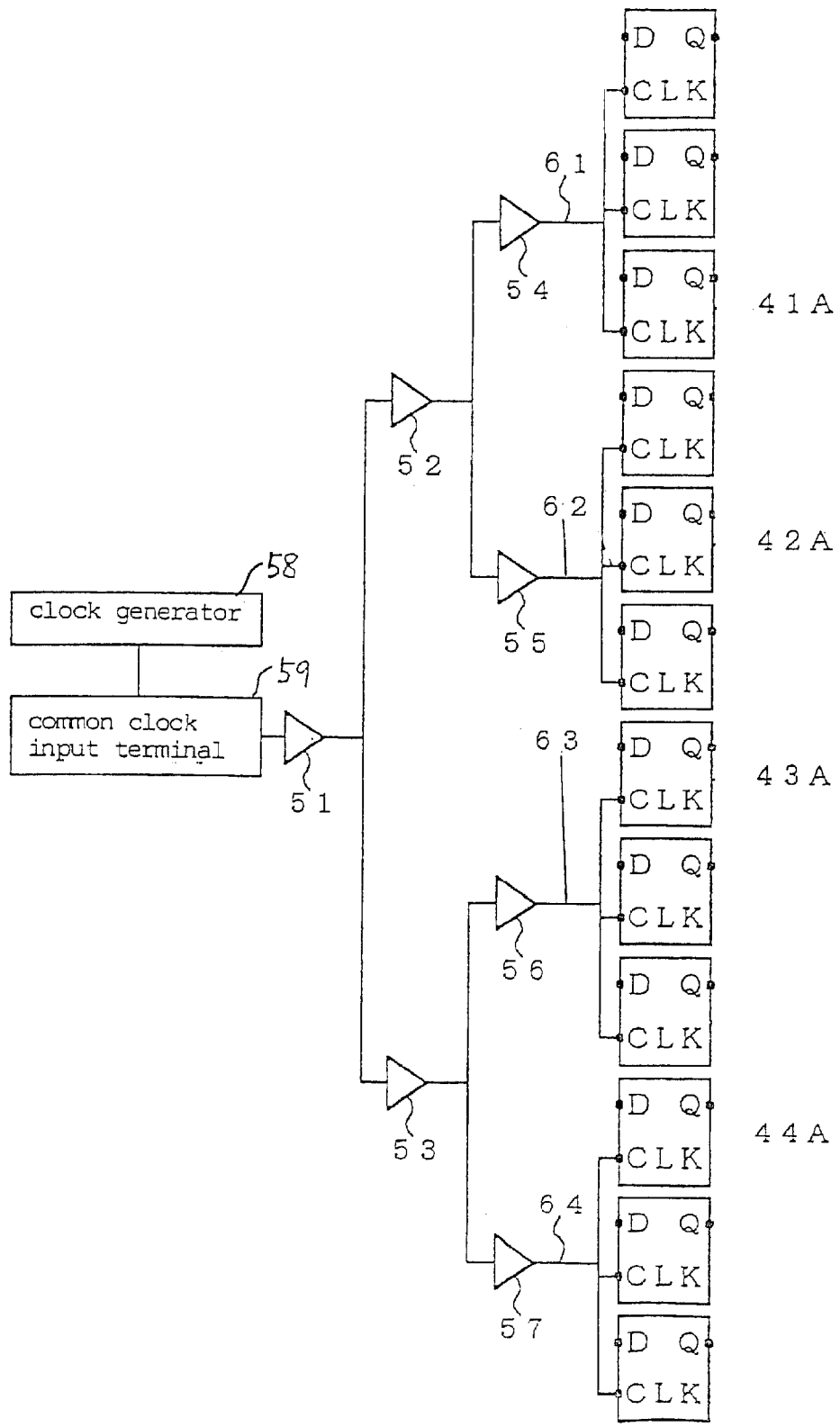
FIG. 7 is a block diagram illustrative of a substituted clock tree in a first novel design method in a first embodiment in accordance with the present invention.
Figure 8:
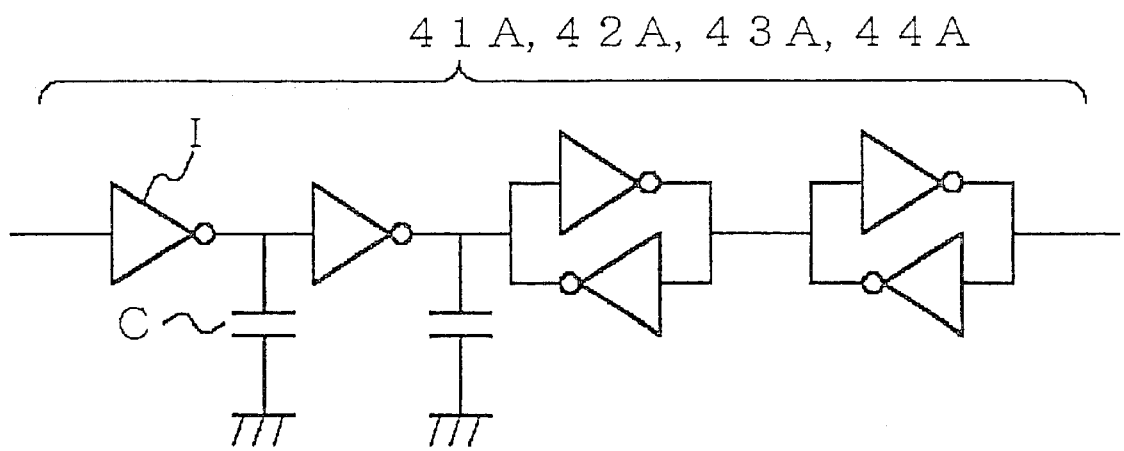
FIG. 8 is a circuit diagram illustrative of a substituted delay flip-flop circuit in FIG. 7.

FIG. 7 is a block diagram illustrative of a substituted clock tree in a first novel design method in a first embodiment in accordance with the present invention. A clock signal is generated by a clock generator circuit 58. The clock signal is then inputted into a common clock input terminal 59 of a first buffer circuit 51. The clock signal is then transmitted from the first buffer circuit 51 to second and third buffer circuits 52 and 53. The clock signal is further transmitted from the second buffer circuit 52 to fourth and fifth buffer circuits 54 and 55. The clock signal is further transmitted from the third buffer circuit 53 to sixth and seventh buffer circuits 56 and 57. The clock signal is furthermore transmitted from the fourth buffer circuit 54 through a tree path 61 to three substituted delay flip-flop circuits 41A. The clock signal is furthermore transmitted from the fifth buffer circuit 55 through a tree path 62 to three substituted delay flip-flop circuits 42A. The clock signal is furthermore transmitted from the sixth buffer circuit 56 through a tree path 63 to three substituted delay flip-flop circuits 43A. The clock signal is furthermore transmitted from the seventh buffer circuit 57 through a tree path 64 to three substituted delay flip-flop circuits 44A. The above tree paths 61, 62, 63 and 64 are extracted as the faster clock tree paths than the average value. As shown in FIG. 7, the tree path 61 extends from the common clock input terminal 59 through the buffer circuits 51, 52, and 54 to the three substituted delay flip-flop circuits 41A. The tree path 62 extends from the common clock input terminal 59 through the buffer circuits 51, 52, and 55 to the three substituted delay flip-flop circuits 42A. The tree path 63 extends from the common clock input terminal 59 through the buffer circuits 51, 53, and 56 to the three substituted delay flip-flop circuits 43A. The tree path 64 extends from the common clock input terminal 59 through the buffer circuits 51, 53, and 57 to the three substituted delay flip-flop circuits 44A. The three substituted delay flip-flop circuits 41A, the three substituted delay flip-flop circuits 42A, the three substituted delay flip-flop circuits 43A, and the three substituted delay flip-flop circuits 44A are the same as each other in delay amount. Each of the three substituted delay flip-flop circuits 41A, the three substituted delay flip-flop circuits 42A, the three substituted delay flip-flop circuits 43A, and the three substituted delay flip-flop circuits 44A has the same circuit configuration. FIG. 8 is a circuit diagram illustrative of a substituted delay flip-flop circuit in FIG. 7. Each of the substituted delay flip-flop circuits 41A, 42A, 43A and 44A comprises a flip-flop circuit region and a delay circuit region, wherein the flip-flop circuit region comprises series connections of plural flip-flop circuits and the delay circuit region comprises series connections of plural delay circuits. Each of the flip-flop circuits comprises a pair of first and second inverter circuits, wherein an input terminal of the first inverter circuit is connected to an output terminal of the second inverter circuit, and further an output terminal of the first inverter circuit is connected to an input terminal of the second inverter circuit. Each of the delay circuits comprises a pair of an inverter circuit and a capacitance, wherein the capacitance is connected between an output terminal of the inverter and a ground line. The series connection of the plural delay circuits is provided on the pre-stage of the series connection of the flip-flop circuit.

Figure 9:
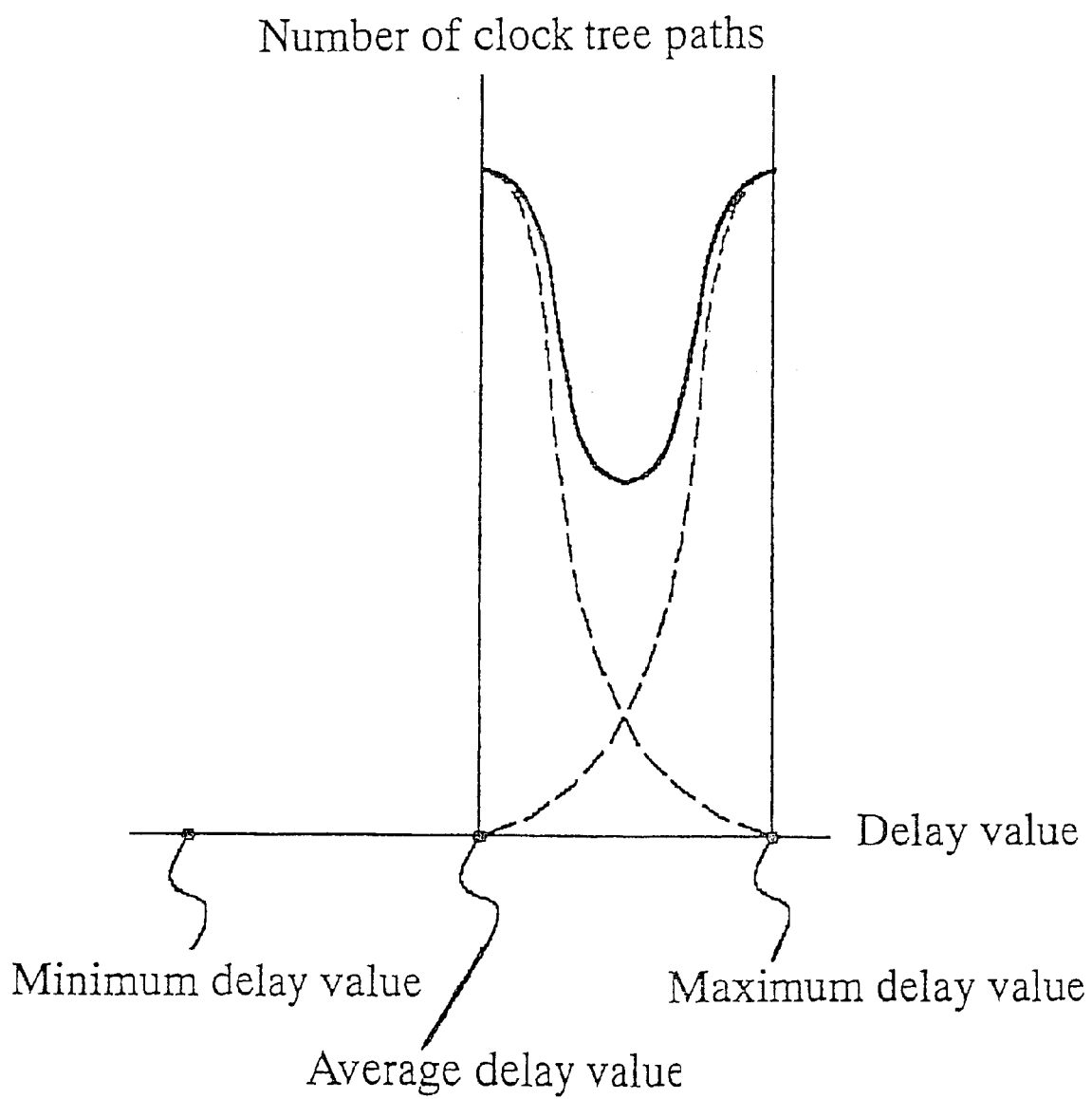
FIG. 9 is a diagram illustrative of a distribution of a delay value of clock tree paths to the substituted delay flip-flop circuits in a first embodiment in accordance with the present invention.

FIG. 9 is a diagram illustrative of a distribution of a delay value of clock tree paths to the substituted delay flip-flop circuits in a first embodiment in accordance with the present invention. The delay value is limited between the maximum value and the average value, wherein the variation in delay values is reduced. Namely, the clock skew value is reduced to a half. This ½-reduced clock skew value is in the acceptable delay value range, wherein no malfunction appears on the flip-flop circuits. For this reason, in the acceptable range, the number of the paths is larger at both ends, for example, just over the average value and just under the maximum value than the center of the acceptable range, for example, intermediate between the average value and the maximum value as well shown in FIG. 9, whereby a possible uniform distribution can be obtained.

In a step S21, layout of the substitute delay flip-flop circuit cells is carried out to prepare real interconnection data.

In a step S22, on the basis of the real interconnection data and a previously prepared delay circuit library, a delay information and a clock skew value are re-prepared to complete the circuit design process in a step S23.

As described above, in accordance with the first novel method of the present invention, clock tree paths faster in delay value than the average delay value are extracted. A batch-substitution process is carried out for batch-substituting all flip-flop circuits connected to the extracted clock tree paths into substitute delay flip-flop circuits which have a delay compensating a difference between the average value of the delay values and a maximum value of the delay values to reduce the clock skew value into a half The batch-substitution process results in a reduction in the number of the processes for obtaining the reduced clock skew.

Second Embodiment

Figure 10:
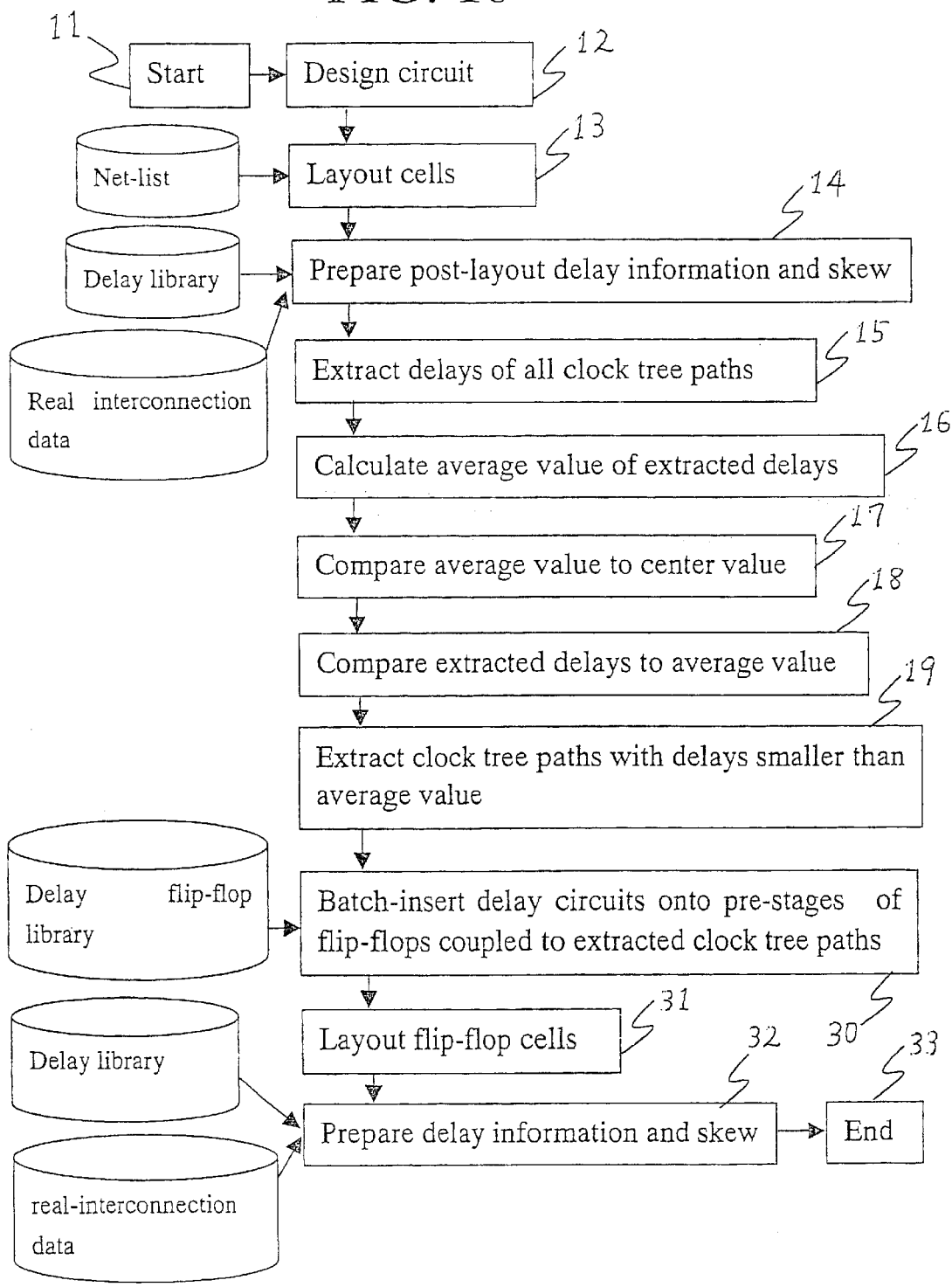
FIG. 10 is a flow chart illustrative of a second novel method in design of a semiconductor integrated circuit with a reduced clock skew to increase a design efficiency and shorten a turnaround time without providing any substantive influence to the semiconductor integrated circuit in a second embodiment in accordance with the present invention.

A second embodiment according to the present invention will be described in detail with reference to the drawings. FIG. 10 is a flow chart illustrative of a second novel method in design of a semiconductor integrated circuit with a reduced clock skew to increase a design efficiency and to shorten a turnaround time without providing any substantive influence to the semiconductor integrated circuit in a second embodiment in accordance with the present invention.

In a step S11, the process is started.

In a step S12, a circuit design is executed to form a net-list.

In a step S13, layout and placement of cells are executed by use of the net-list to form real interconnection data.

In a step S14, a post-layout delay information and a clock skew value are prepared on the basis of the real interconnection data and a previously prepared delay library.

In a step S15, on the basis of the post-layout delay information and the clock skew value, a delay value of each of all paths of the clock-tree is extracted.

In a step S16, on the basis of the delay values of all paths of the clock-tree, an average of the delay values is calculated.

In a step S17, it is verified whether or not the calculated average is within an acceptable range which has previously been set, wherein the acceptable range has a range center which corresponds to an intermediate value between the maximum and minimum values of the delay values. As shown in FIG. 5, the distribution of the delay value of the clock tree paths is symmetrical with reference to the average value "C" which is intermediate between the maximum and minimum delay values. It is preferable that the distribution of the delay value of the clock tree paths is the normal distribution, wherein the average value corresponds to the center of the acceptable range. If the calculated average is within the acceptable range, then the calculated average is not so different from the center of the maximum and minimum delay values. This means that the distribution of the delay value of the clock tree paths is almost symmetrical with reference to the center of the maximum and minimum delay values. In this case, the following batch process is carried out. If the calculated average is outside the acceptable range, then the calculated average is largely different from the center of the maximum and minimum delay values. This means that the distribution of the delay value of the clock tree paths is largely asymmetrical with reference to the center of the maximum and minimum delay values. In this case, individual processes are executed in place of the batch-process.

In a step S18, if the calculated average is within the acceptable range, then each of the extracted individual delay values of the individual clock tree paths is compared to the calculated average value.

In a step S19, clock tree paths faster than the average value are extracted.

As shown in FIG. 6, a clock signal is generated by a clock generator circuit 58. The clock signal is then inputted into a common clock input terminal 59 of a first buffer circuit 51. The clock signal is then transmitted from the first buffer circuit 51 to second and third buffer circuits 52 and 53. The clock signal is further transmitted from the second buffer circuit 52 to fourth and fifth buffer circuits 54 and 55. The clock signal is further transmitted from the third buffer circuit 53 to sixth and seventh buffer circuits 56 and 57. The clock signal is furthermore transmitted from the fourth buffer circuit 54 through a tree path 61 to three flip-flop circuits 41. The clock signal is furthermore transmitted from the fifth buffer circuit 55 through a tree path 62 to three flip-flop circuits 42. The clock signal is furthermore transmitted from the sixth buffer circuit 56 through a tree path 63 to three flip-flop circuits 43. The clock signal is furthermore transmitted from the seventh buffer circuit 57 through a tree path 64 to three flip-flop circuits 44. The above tree paths 61, 62, 63 and 64 are extracted as the faster clock tree paths than the average value. As shown in FIG. 6, the tree path 61 extends from the common clock input terminal 59 through the buffer circuits 51, 52, and 54 to the three flip-flop circuits 41. The tree path 62 extends from the common clock input terminal 59 through the buffer circuits 51, 52, and 55 to the three flip-flop circuits 42. The tree path 63 extends from the common clock input terminal 59 through the buffer circuits 51, 53, and 56 to the three flip-flop circuits 43. The tree path 64 extends from the common clock input terminal 59 through the buffer circuits 51, 53, and 57 to the three flip-flop circuits 44. Whereas the four clock tree paths are faster than the average delay value, it is probable that six clock tree paths are extracted as faster than the average value in cause of the twelve flip-flop circuits.

In a step S30, a batch-insertion process is carried out, so that insertion delay circuits are inserted onto previous stages of the flip-flop circuits coupled to the clock tree paths faster in delay value than the average value, wherein the insertion delay circuits have a delay which compensates to a difference between the average value and the maximum value. The insertion delay circuits are selected from a previously prepared delay circuit library.

Figure 11:
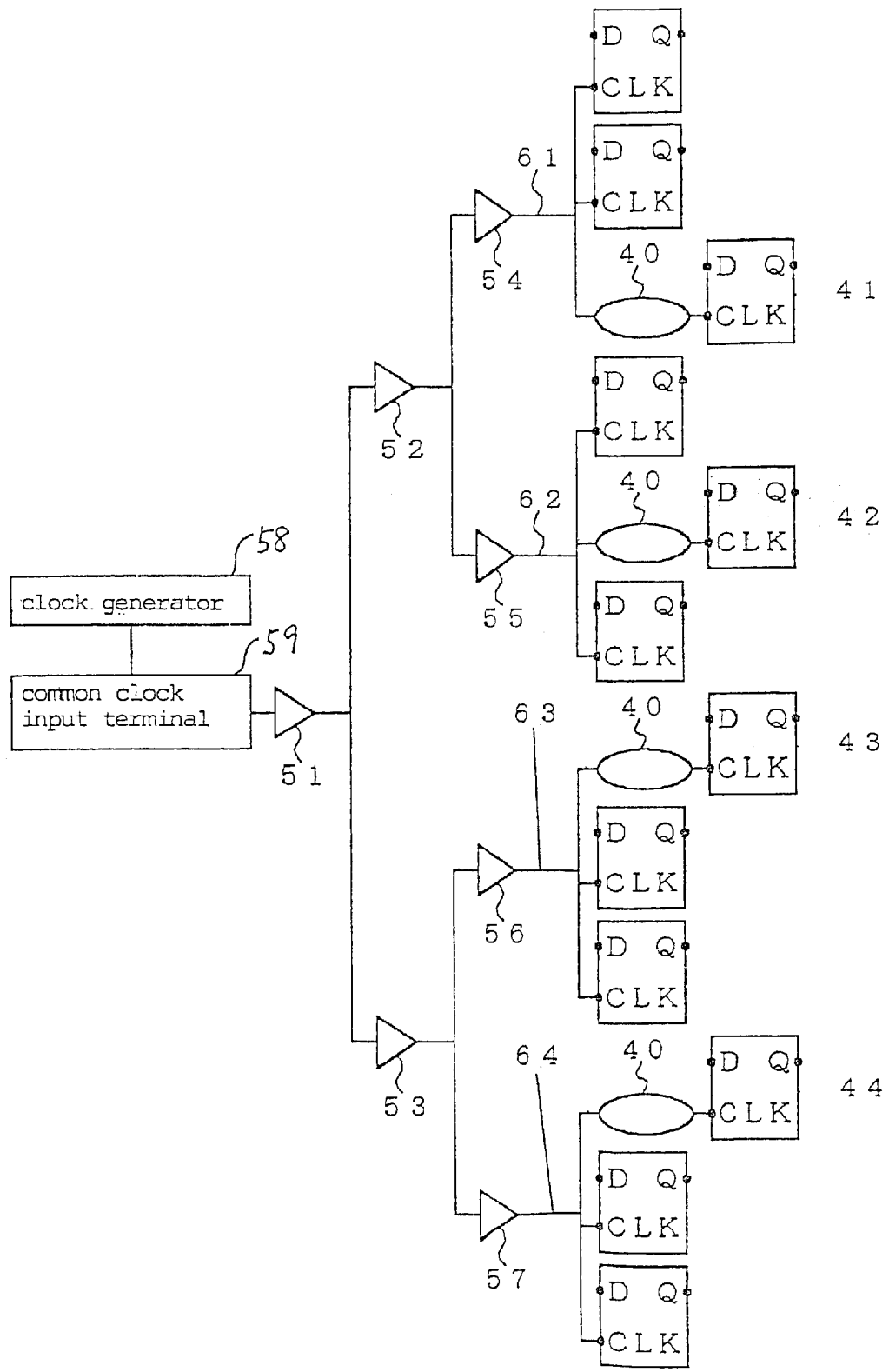
FIG. 11 is a block diagram illustrative of a batch-processed clock tree in a second novel design method in a second embodiment in accordance with the present invention.
Figure 12:
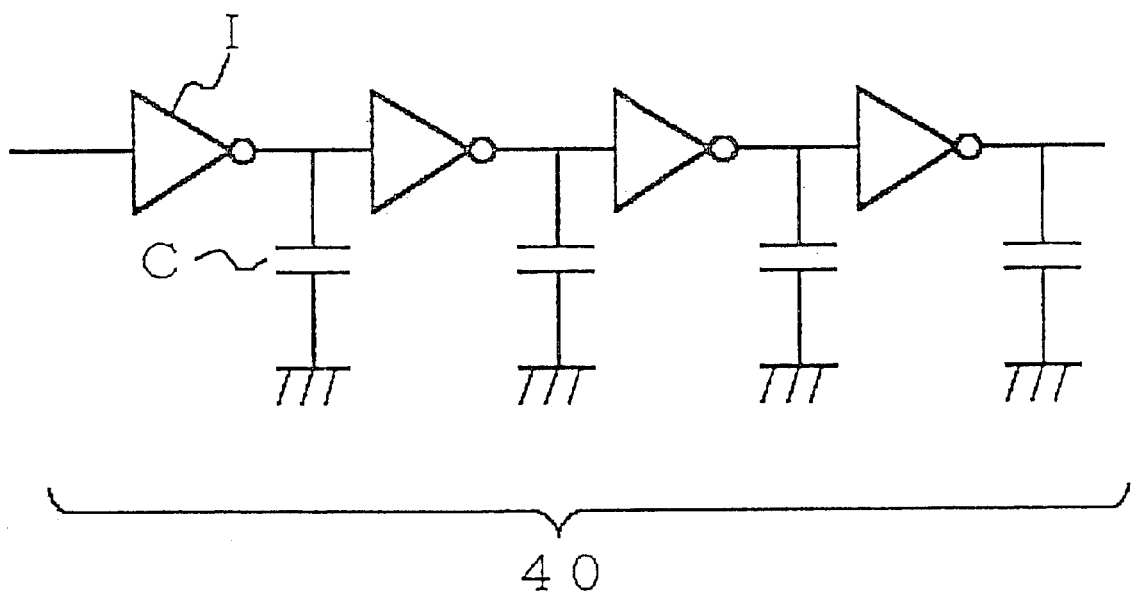
FIG. 12 is a circuit diagram illustrative of a delay circuit in FIG.

FIG. 11 is a block diagram illustrative of a batch-processed clock tree in a second novel design method in a second embodiment in accordance with the present invention. A clock a hi signal is generated by a clock generator circuit 58. The clock signal is then inputted into a common clock input terminal 59 of a first buffer circuit 51. The clock signal is then transmitted from the first buffer circuit 51 to second and third buffer circuits 52 and 53. The clock signal is further transmitted from the second buffer circuit 52 to fourth and fifth buffer circuits 54 and 55. The clock signal is further transmitted from the third buffer circuit 53 to sixth and seventh buffer circuits 56 and 57. The clock signal is furthermore transmitted from the fourth buffer circuit 54 through a tree path 61 to three extracted flip-flop circuits 41A, wherein a delay circuit 40 is provided on a previous stage of one of the three flip-flip circuits 41A. The delay circuit 40 is connected to a clock terminal of one of the flip-flop circuits 41A. The delay circuit 40 has a delay which compensates a difference between the average delay value and the maximum delay value. The clock signal is furthermore transmitted from the fifth buffer circuit 55 through a tree path 62 to three extracted flip-flop circuits 42A, wherein a delay circuit 40 is provided on a previous stage of one of the three flip-flop circuits 42A. The delay circuit 40 is connected to a clock terminal of one of the three flip-flop circuits 42A. The delay circuit 40 has a delay which compensates a difference between the average delay value and the maximum delay value. The clock signal is furthermore transmitted from the sixth buffer circuit 56 through a tree path 63 to three extracted flip-flop circuits 43A, wherein a delay circuit 40 is provided on a previous stage of one of the three flip-flop circuits 43A. The delay circuit 40 is connected to a clock terminal of one of the three flip-slop circuits 43A. The delay circuit 40 has a delay which compensates a difference between the average delay value and the maximum delay value. The clock signal is furthermore transmitted from the seventh buffer circuit 57 through a tree path 64 to three extracted flip-flop circuits 44A, wherein a delay circuit 40 is provided on a previous stage of one of the three flip-flop circuits 44A. The delay circuit 40 is connected to a clock terminal of one of the three flip-flop circuits 44A. The delay circuit 40 has a delay which compensates a difference between the average delay value and the maximum delay value. The above tree paths 61, 62, 63 and 64 are extracted as the faster clock tree paths than the average value. As shown in FIG. 11, the tree path 61 extends from the common clock input terminal 59 through the bugger circuits 51, 52, and 54 and the delay circuit 40 to the three extracted flip-flop circuits 41A. The tree path 62 extends from the common clock input terminal 59 through the buffer circuits 51, 52, and 55 and the delay circuit 40 to the three extracted flip-flop circuits 42A. The tree path 63 extends form the common clock input terminal 59 through the buffer circuits 51, 53, and 56 and the delay circuits 40 to the three extracted flip-flop circuits 43A. The three path 64 extends from the common clock input terminal 59 through the buffer circuits 51, 53, and 57 and the delay circuit 40 to the three extracted flip-flop circuits 44A. The delay circuits 40 are the same as each other in delay amount. Each of the delay circuits 40 has the same circuit configuration. FIG. 12 is a circuit diagram illustrative of a delay circuit in FIG. 11. Each of the delay circuits 40 comprises series connections of plural pairs of inverters and capacitors, wherein the capacitor is connected between an output terminal of the inverter and a ground line. The series connection of a plural pairs of the inverters and capacitors is provided on the pre-stage of the flip-flop circuit.

As shown in FIG. 9, the delay value is limited between the maximum value and the average value, wherein the variation in delay values is reduced. Namely, the clock skew value is reduced to a half. This ½-reduced clock skew value is in the acceptable delay value range, wherein no malfunction appears on the flip-flop circuits. For this reason, in the acceptable range, the number of the paths is larger at both ends, for example, just over the average value and just under the maximum value than the center of the acceptable range, for example, intermediate between the average value and the maximum value as well shown in FIG. 9, whereby a possible uniform distribution can be obtained.

In a step S31, layout of the flip-flop circuit cells is carried out to prepare real interconnection data.

In a step S32, on the basis of the real interconnection data and a previously prepared delay circuit library, a delay information and a clock skew value are re-prepared to complete the circuit design process in a step S33.

As described above, in accordance with the second novel method of the present invention, clock tree paths faster in delay value than the average delay value are extracted. A batch-insertion process is carried out for batch-inserting, inserting delay circuits onto a previous stage of all of flip-flop circuits connected to the extracted clock tree paths, wherein the inserting delay circuits have a delay compensating a difference between the average value of the delay values and a maximum value of the delay values to reduce the clock skew value into a half. The batch-insertion process results in a reduction in the number of the processes for obtaining the reduced clock skew.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A layout method in design for a semiconductor integrated circuit having clock tree paths, said method comprising the steps of:
   extracting delay values of all of the clock tree paths;
   calculating an average delay value from the extracted delay values;
   comparing each of the delay values of the clock tree paths to the average delay value for extracting flip-flop circuits connected to the clock tree paths which have delay values smaller than the average delay value; and
   carrying out a batch-substituting process for batch-substituting all of the extracted flip-flop circuits by substitutional delay flip-flop circuits which have a delay compensating a difference between the average delay value and a maximum value of the delay values of all of the clock tree paths.

2. The method as claimed in claim 1, wherein the substitutional delay flip-flop circuits are extracted from a delay flip-flop library.

3. The method as claimed in claim 1, wherein a distribution in the number of the clock tree paths over delay value after the batch-substituting process is limited within a range between the average delay value and the maximum delay value.

4. The method as claimed in claim 3, wherein the number of the clock tree paths is higher in the vicinity of the average delay value and the maximum delay value than at an intermediate delay value between the average delay value and the maximum delay value.

5. The method as claimed in claim 4, wherein the distribution in the number of the clock tree paths over delay value is substantially symmetrical with reference to the intermediate delay value between the average delay value and the maximum delay value.

6. The method as claimed in claim 1, further comprising the step of:
   carrying out a layout process for cells including the extracted flip-flop circuits and the substitutional delay flip-flop circuits to prepare real interconnection data; and
   preparing a delay information and a skew value on the basis of both the real interconnection data and a previously prepared delay library.

7. A layout method in design for a semiconductor integrated circuit having clock tree paths, said method comprising the steps of;
   extracting delay values of all of the clock tree paths;
   calculating an average delay value from the extracted delay values;
   comparing each of the delay values of the clock tree paths to the average delay value for extracting flip-flop circuits connected to the clock tree paths which have delay values smaller than the average delay value; and
   carrying out a batch-inserting process for batch-inserting delay circuits onto previous stages of all of the extracted flip-flop circuits, and the delay circuits have a delay compensating a difference between the average delay value and a maximum value of the delay values of all of the clock tree paths.

8. The method as claimed in claim 7, wherein the delay circuits are extracted from a delay circuit library.

9. The method as claimed in claim 7, wherein a distribution in the number of the clock tree paths over delay value after the batch-inserting process is limited within a range between the average delay value and the maximum delay value.

10. The method as claimed in claim 9, wherein the number of the clock tree paths is higher in the vicinity of the average delay value and the maximum delay value than at an intermediate delay value between the average delay value and the maximum delay value.

11. The method as claimed in claim 10, wherein the distribution in the number of the clock tree paths over delay value is substantially symmetrical with reference to the intermediate delay value between the average delay value and the maximum delay value.

12. The method as claimed in claim 1, further comprising the steps of:
   carrying out a layout process for cells including the extracted flip-flop circuits and the delay circuits to prepare real interconnection data; and preparing a delay information and a skew value on the basis of both the real interconnection data and a previously prepared delay library.

13. A computer program for layout processes in design for a semiconductor integrated circuit having clock tree paths, said computer program comprising the steps of:

extracting delay values of all of the clock tree paths;

calculating an average delay value from the extracted delay values;

comparing each of the delay values of the clock tree paths to the average delay value for extracting flip-flop circuits connected to the clock tree paths which have delay values smaller than the average delay value; and carrying out a batch-substituting process for batch-substituting all of the extracted flip-flop circuits by substitutional delay flip-flop circuits which have a delay compensating a difference between the average delay value and a maximum value of the delay values of all of the clock tree paths.

14. The computer program as claimed in claim 13, wherein the substitutional delay flip-flop circuits are extracted from a delay flip-flop library.

15. The computer program as claimed in claim 13, wherein a distribution in the number of the clock tree paths over delay value after the batch-substituting process is limited within a range between the average delay value and the maximum delay value.

16. The computer program as claimed in claim 15, wherein the number of the clock tree paths is higher in the vicinity of the average delay value and the maximum delay value than at an intermediate delay value between the average delay value and the maximum delay value.

17. The computer program as claimed in claim 16, wherein the distribution in the number of the clock tree paths over delay value is substantially symmetrical with reference to the intermediate delay value between the average delay value and the maximum delay value.

18. The computer program as claimed in claim 13, further comprising the steps of:

carrying out a layout process for cells including the extracted flip-flop circuits and the substitutional delay flip-flop circuits to prepare real interconnection data; and preparing a delay information and a skew value on the basis of both the real interconnection data and a previously prepared delay library.

19. A computer program for layout processes in design for a semiconductor integrated circuit having clock tree paths, said computer program comprising the steps of;

extracting delay values of all of the clock tree paths;

calculating an average delay value from the extracted delay values;

comparing each of the delay values of the clock tree paths to the average delay value for extracting flip-flop circuits connected to the clock tree paths which have delay values smaller than the average delay value; and carrying out a batch-inserting process for batch-inserting delay circuits onto previous stages of all of the extracted flip-flop circuits, and the delay circuits have a delay compensating a difference between the average delay value and a maximum value of the delay values of all of the clock tree paths.

20. The computer program as claimed in claim 19, wherein the delay circuits are extracted from a delay circuit library.

21. The computer program as claimed in claim 19, wherein a distribution in the number of the clock tree paths over delay value after the batch-inserting process is limited within a range between the average delay value and the maximum delay value.

22. The computer program as claimed in claim 21, wherein the number of the clock tree paths is higher in the vicinity of the average delay value and the maximum delay value than at an intermediate delay value between the average delay value and the maximum delay value.

23. The computer program as claimed in claim 22, wherein the distribution in the number of the clock tree paths over delay value is substantially symmetrical with reference to the intermediate delay value between the average delay value and the maximum delay value.

24. The computer program as claimed in claim 19, further comprising the step of:

carrying out a layout process for cells including the extracted flip-flop circuits and the delay circuits to prepare real interconnection data; and preparing a delay information and a skew value on the basis both the real interconnection data and a previously prepared delay library.

25. A semiconductor integrated circuit having a common clock input terminal, plural flip-flop circuits, and clock tree paths extending from the common clock input terminal to the flip-flop circuits, wherein the flip-flop circuits are classified into first type flip-flop circuits having delay values in a range between an average delay value of individual delay values of the clock tree paths arid a maximum value of the individual delay values of all of the clock tree paths, and second type flip-flop circuits having a delay which compensates a difference between the average delay value and the maximum value.

26. The semiconductor integrated circuit as claimed in claim 25, wherein the first type flip-flop circuit comprises a flip-flop circuit configuration only, and the second type flip-flop circuit comprises both the flip-flop circuit configuration and a delay circuit configuration provided on a previous stage of the flip-flop circuit configuration.

27. The semiconductor integrated circuit as claimed in claim 25, wherein a distribution in the number of the clock tree paths over delay value after the batch-inserting process is limited within a range between the average delay value and the maximum delay value.

28. The semiconductor integrated circuit as claimed in claim 27, wherein the number of the clock tree paths is higher in the vicinity of the average delay value and the maximum delay value than at an intermediate delay value between the average delay value and the maximum delay value.

29. The semiconductor integrated circuit as claimed in claim 28, wherein the distribution in the number of the clock tree paths over delay value is substantially symmetrical with reference to the intermediate delay value between the average delay value and the maximum delay value.

30. A semiconductor integrated circuit having a common clock input terminal, plural flip-flop circuits, and clock tree paths extending from the common clock input terminal to the flip-flop circuits, wherein the flip-flop circuits are classified into first type flip-flop circuits having delay values in a first range between an average delay value of individual delay values of the clock tree paths and a maximum value of the individual delay values of all of the clock tree paths, and second type flip-flop circuits having delay values in a second range between the average delay value and a minimum value of the individual delay values of all of the clock tree paths, and wherein delay circuits having a delay which compensates a difference between the average delay value and the maximum value are provided on previous stages of the second type flip-flop circuits.

31. The semiconductor integrated circuit as claimed in claim 30, wherein a distribution in the number of the clock tree paths over delay value after the batch-inserting process is limited within a range between the average delay value and the maximum delay value.

32. The semiconductor integrated circuit as claimed in claim 31, wherein the number of the clock tree paths is higher in the vicinity of the average delay value and the maximum delay value than at an intermediate delay value between the average delay value and the maximum delay value.

33. The semiconductor integrated circuit as claimed in claim 32, wherein the distribution in the number of the clock tree paths over delay value is substantially symmetrical with reference to the intermediate delay value between the average delay value and the maximum delay value.

34. The method as claimed in claim 1, wherein in said carrying out a batch-substituting process step, only flip-flop circuits connected to the clock tree paths which have delay values smaller than the average delay value are extracted.

35. The method as claimed in claim 7, wherein said comparing step further comprises keeping flip-flop circuits connected to the clock tree paths that have delay values greater than or equal to the average delay value.

36. The computer program as claimed in claim 13, wherein said comparing step further comprises not extracting flip-flop circuits connected to the clock tree paths that have delay values greater than or equal to the average delay value.

37. The semiconductor integrated circuit as claimed in claim 25, wherein the second flip-flop circuits only have a delay which compensates a difference between the average delay value and the maximum value and does not have a delay which compensates the difference between the average value and a minimum value of the individual delay values of all the clock tree paths.

* * * * *